United States Patent
Tomohiro

(10) Patent No.: US 9,907,175 B2
(45) Date of Patent: Feb. 27, 2018

(54) SEMICONDUCTOR DEVICE

(71) Applicant: Atsushi Tomohiro, Tokyo (JP)

(72) Inventor: Atsushi Tomohiro, Tokyo (JP)

(73) Assignee: Longitude Semiconductors S.A.R.L., Luxembourg (LU)

(*) Notice: Subject to any disclaimer, the term of this patent is extended or adjusted under 35 U.S.C. 154(b) by 127 days.

(21) Appl. No.: 14/771,662

(22) PCT Filed: Mar. 4, 2014

(86) PCT No.: PCT/JP2014/055348
§ 371 (c)(1),
(2) Date: Aug. 31, 2015

(87) PCT Pub. No.: WO2014/136735
PCT Pub. Date: Sep. 12, 2014

(65) Prior Publication Data
US 2016/0029491 A1 Jan. 28, 2016

(30) Foreign Application Priority Data
Mar. 4, 2013 (JP) ................... 2013-041598

(51) Int. Cl.
*H05K 7/10* (2006.01)
*H05K 7/12* (2006.01)
(Continued)

(52) U.S. Cl.
CPC ........... *H05K 1/181* (2013.01); *H01L 23/498* (2013.01); *H01L 23/49827* (2013.01);
(Continued)

(58) Field of Classification Search
CPC ....... H01L 2924/00; H01L 2224/32225; H01L 2224/48227; H01L 2224/73265;
(Continued)

(56) References Cited

U.S. PATENT DOCUMENTS 7,187,060 B2   3/2007   Usui
7,745,910 B1 *   6/2010   Olson ................... H01L 21/561
                                                        257/659

(Continued)

FOREIGN PATENT DOCUMENTS

JP     2011026634     1/1999
JP     2001345399     12/2001

(Continued)

OTHER PUBLICATIONS

Application No. PCT/JP2014/055348, International Search Report, dated Jun. 3, 2014.

*Primary Examiner* — Yuriy Semenenko
(74) *Attorney, Agent, or Firm* — Kunzler, PC

(57) ABSTRACT

One semiconductor device includes a wiring substrate, a semiconductor chip, and a sealing body. The wiring substrate includes an insulating base material, a first conductive pattern formed on one surface of the insulating base material, and a second conductive pattern formed on one surface of the insulating base material, connected to the first conductive pattern and having an end face exposed to the side. The semiconductor chip is mounted on the wiring substrate so as to overlap with the first conductive pattern. The sealing body is formed on the wiring substrate so as to cover the semiconductor chip.

8 Claims, 7 Drawing Sheets

(51) Int. Cl.
*H05K 1/18* (2006.01)
*H01L 23/00* (2006.01)
*H01L 23/498* (2006.01)
*H01L 25/10* (2006.01)
*H05K 1/02* (2006.01)
*H05K 1/11* (2006.01)
*H01L 23/31* (2006.01)
*H01L 21/56* (2006.01)

(52) U.S. Cl.
CPC ............ *H01L 24/97* (2013.01); *H01L 25/105* (2013.01); *H05K 1/0203* (2013.01); *H05K 1/111* (2013.01); *H01L 21/561* (2013.01); *H01L 23/3128* (2013.01); *H01L 23/49816* (2013.01); *H01L 24/73* (2013.01); *H01L 2224/16225* (2013.01); *H01L 2224/32225* (2013.01); *H01L 2224/48091* (2013.01); *H01L 2224/48227* (2013.01); *H01L 2224/48228* (2013.01); *H01L 2224/73204* (2013.01); *H01L 2224/73265* (2013.01); *H01L 2224/92247* (2013.01); *H01L 2224/97* (2013.01); *H01L 2225/1023* (2013.01); *H01L 2225/1058* (2013.01); *H01L 2225/1094* (2013.01); *H01L 2924/181* (2013.01); *H05K 2201/10159* (2013.01)

(58) Field of Classification Search
CPC . H01L 2224/16225; H01L 2224/48091; H01L 2224/73204; H01L 2224/92247; H01L 2224/97; H01L 2924/181; H01L 2924/00014; H01L 21/561
See application file for complete search history.

(56) References Cited

U.S. PATENT DOCUMENTS

| | | | |
|---|---|---|---|
| 7,906,371 B2 * | 3/2011 | Kim | H01L 21/561 438/106 |
| 9,412,703 B1 * | 8/2016 | Huang | H01L 23/49838 |
| 2004/0178500 A1 * | 9/2004 | Usui | H01L 23/49822 257/734 |
| 2007/0126112 A1 * | 6/2007 | Cho | H05K 1/056 257/700 |

FOREIGN PATENT DOCUMENTS

| | | | |
|---|---|---|---|
| JP | 2004172176 | | 6/2004 |
| JP | 2008010602 | | 1/2008 |
| JP | 2008218505 | * | 9/2008 |
| JP | 2012182395 | | 9/2012 |
| TW | I293796 B | | 2/2008 |
| TW | 200945527 A | | 11/2009 |
| TW | 201246490 A1 | | 11/2012 |

* cited by examiner

SEMICONDUCTOR DEVICE

TECHNICAL FIELD

The present invention relates to a semiconductor device having a semiconductor chip.

BACKGROUND

Recent advances in increasing the speed of a semiconductor device having a semiconductor chip such as a memory chip or a logic chip, increasing the operating ratio of a semiconductor chip, and the like have made semiconductor chips more prone to generating heat. Therefore, the heat must be expelled outside the semiconductor device. In a ball grid array (BGA) type semiconductor device, however, many organic members having poor heat transfer properties are used, making it difficult to expel heat from the semiconductor chip of the semiconductor device into the atmosphere.

With the semiconductor device described in Patent Document 1 (Japanese Unexamined Patent Publication No. 2000-68403), a package housing a semiconductor chip and comprising a wiring substrate and a sealing body is mounted on a mounting substrate. A plurality of heat-dissipating solder balls (solder bumps) are disposed in a central region of the mounting substrate-connecting surface (substrate-connecting surface) of the wiring substrate constituting the package of the semiconductor device for holding the semiconductor chip (semiconductor element). Because the semiconductor device disclosed in Patent Document 1 has a configuration in which heat from the semiconductor chip is transferred to the plurality of heat-dissipating solder balls, the heat generated by the semiconductor chip is transferred through the heat-dissipating solder balls to the connected mounting substrate, and expelled from the mounting substrate to outside the semiconductor device.

PATENT DOCUMENT

Patent Document 1: Japanese Unexamined Patent Publication No. 2000-68403

OUTLINE OF THE INVENTION

Problems that the Invention is to Solve

The invention disclosed in Patent Document 1, however, requires separately disposing heat-dissipating solder balls, which increases the overall production cost of the semiconductor device.

A case will be described in which the package disclosed in Patent Document 1 is used to construct a package-on-package (PoP) arrangement comprising a plurality of stacked packages having different types of semiconductor chips. With a PoP semiconductor device, the semiconductor chip of a package located below is disposed just below a central region of a package stacked above, which leaves no space for arranging a plurality of heat-dissipating solder balls in the central region of the connecting surface of the package stacked above. If a gap were provided between the upper and lower packages for arranging heat-dissipating solder balls the semiconductor chip of the lower package would contact the heat-dissipating solder balls and the heat-dissipating solder balls would not contact the mounting substrate. As a result, the problem would arise that heat generated by the semiconductor chip could not be transferred through the heat-dissipating solder balls to the mounting substrate and expelled outside, and the semiconductor device would become heated.

Means of Solving the Problems

The semiconductor device of the present invention comprises a wiring substrate, a semiconductor chip, and a sealing body. The wiring substrate has an insulating base material, a first conductive pattern formed on a first surface of the insulating base material, and a second conductive pattern formed on the first surface of the insulating base material, connected to the first conductive pattern, and exposed to the side at an end face. The semiconductor chip is mounted on the wiring substrate so as to overlie the first conductive pattern. The sealing body is formed on the wiring substrate so as to cover the semiconductor chip.

Effects of the Invention

According to the present invention, the first conductive pattern and the second conductive pattern connected to the first conductive pattern are formed on a first surface of the insulating base material. Heat generated by the semiconductor chip mounted so as to overlie the first conductive pattern is transferred to the first conductive pattern. The heat transferred to the first conductive pattern is transferred to the second conductive pattern, and expelled outside the semiconductor device from an end face of the second conductive pattern exposed to the side. Therefore, there is no need to form a plurality of heat-dissipating solder balls in a central region of the wiring substrate of the semiconductor chip, which reduces the overall production cost of the semiconductor device. Because no heat-dissipating solder balls are formed, the semiconductor chip of the present invention can also be applied to a PoP semiconductor device.

Expelling the heat generated by the semiconductor chip through the first conductive pattern to the outside from the end face of the second conductive pattern exposed at the side impedes the semiconductor device becoming heated due to the heat generated by the semiconductor chip itself, and improves the reliability of the semiconductor device.

EMBODIMENTS OF THE INVENTION

Embodiments of the present invention will be described hereinafter with reference to the appended drawings.

First Embodiment

Figure 1:
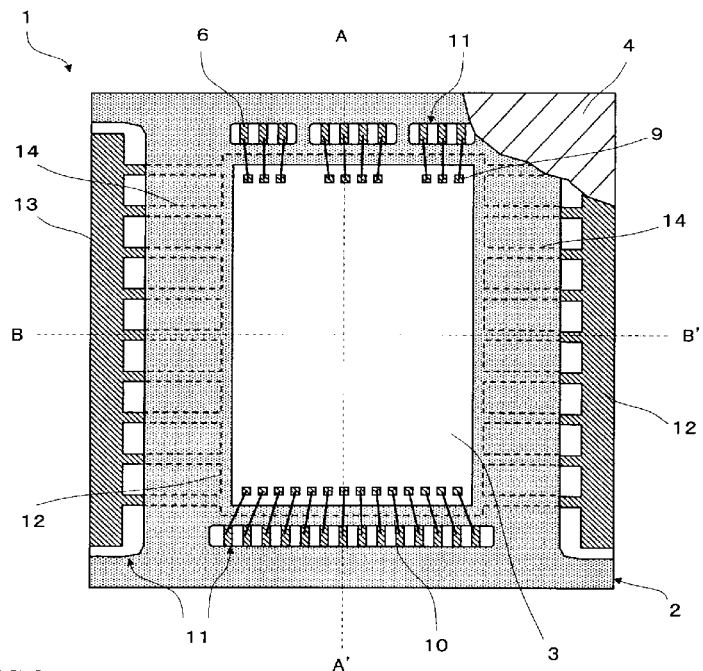
FIG. 1 is a plan view showing the semiconductor device of a first embodiment of the present invention.
Figure 2A:
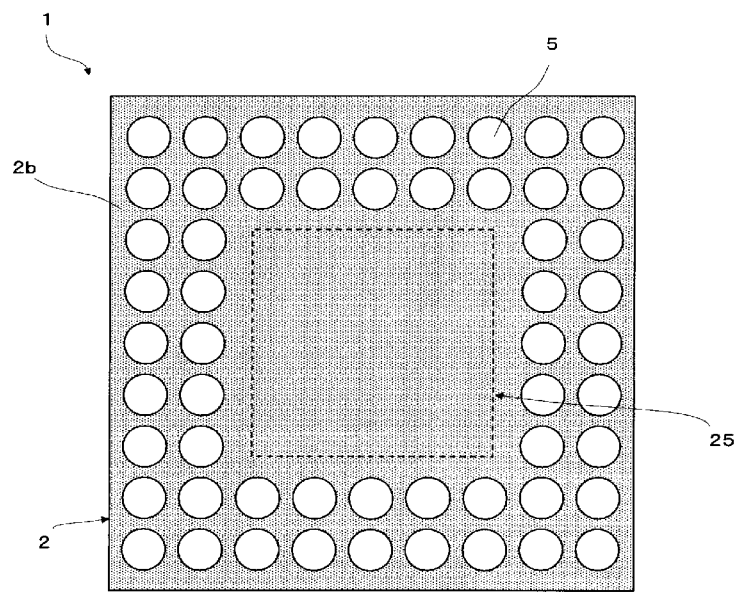
FIG. 2a is a bottom view showing the semiconductor device of the first embodiment.
Figure 2B:
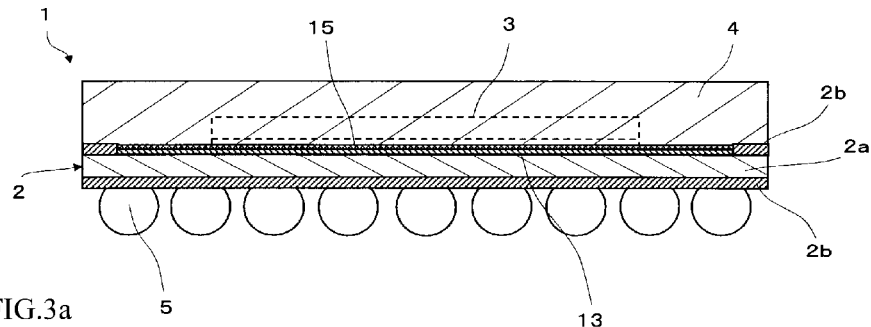
FIG. 2b is a side view showing the semiconductor device of the first embodiment.

FIG. 1 is a plan view showing the semiconductor device of a first embodiment of the present invention, FIG. 2a is a bottom view showing the semiconductor device of the first embodiment, and FIG. 2b is a side view showing the semiconductor device of the first embodiment.

As shown in FIGS. 1 and 2b, a semiconductor device 1 has a wiring substrate 2 comprising an insulating base material 2a on a first surface of which predetermined wiring patterns (not shown), a first conductive pattern 12, and a second conductive pattern 13 have been formed; and a semiconductor chip 3 mounted on a central region of the first surface of the wiring substrate 2. The semiconductor device 1 also has a sealing body 4 formed on the first surface of the wiring substrate 2 so as to cover the semiconductor chip 3. The sealing body 4 has been partially cut away in FIG. 1 to show the internal structure.

Figure 3A:
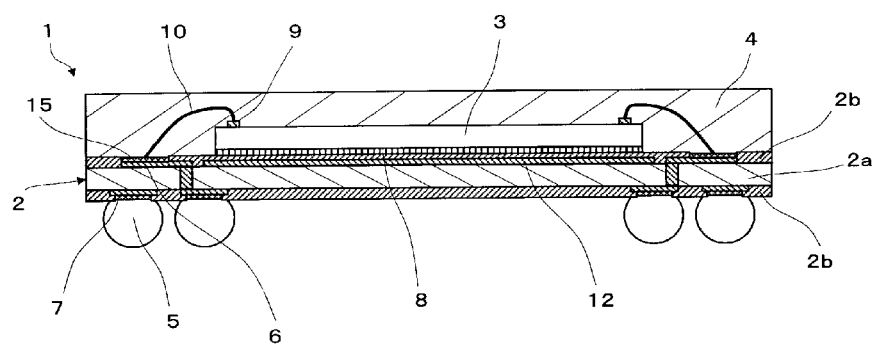
FIG. 3a is a sectional view at A-A' in FIG. 1.

The wiring substrate 2 comprises an insulating base material 2a such as a glass epoxy substrate. Predetermined wiring patterns (not shown) are formed on a first surface of the insulating base material 2a and on a second surface, and these wiring patterns are covered by insulating films 2b such as solder resist films. The wiring pattern on the first surface is formed in a location which does not overlap in plan view or connect to the first conductive pattern 12 and the second conductive pattern 13. As shown in FIGS. 1 and 3a, the insulating films 2b have openings 11 located opposite connection pads 6 (described below) and the second conductive pattern 13. A plurality of connection pads 6, which are connected to the wiring pattern formed on the first surface of the wiring substrate 2, are exposed through the openings 11 along two opposite sides of the mounted semiconductor chip 3. A plurality of lands 7 are exposed through the openings 11 in the insulating film 2b formed on the second surface of the wiring substrate 2. The connection pads 6 and the lands 7 are formed of Cu or the like, and are electrically connected through wiring formed within the wiring substrate 2. On the second surface of the wiring substrate 2, as shown in FIG. 2a, a plurality of solder balls (metal balls) 5 connected to the lands 7 are disposed in two rows along each side of the wiring substrate 2, in a region excluding the central region of the second surface of the wiring substrate 2.

The semiconductor chip 3 is, for example, a dynamic random access memory (DRAM), and is formed in a rectangular plate shape as shown in FIG. 1. A plurality of electrode pads 9 are disposed along opposite sides on a first surface of the semiconductor chip 3. As shown in FIG. 3a, the opposite surface (the connecting surface) to the first surface of the semiconductor chip 3 is connected via an adhesive member 8 to a central region of the wiring substrate 2. An insulating paste or a die attached film (DAF), for example, is used for the adhesive member 8. As shown in FIGS. 1 and 3a, the connection pads 6 and the electrode pads 9 are adjacent, and are electrically connected by conductive wires 10.

Figure 3B:
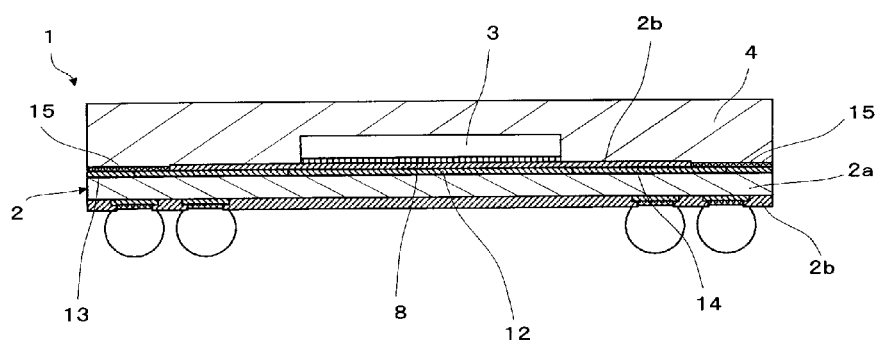
FIG. 3b is a sectional view at B-B' in FIG. 1.

As shown in FIGS. 1 and 3b, in plan view, the first conductive pattern 12, which is larger in size than the semiconductor chip 3, is formed on the first surface of the insulating base material 2a of the wiring substrate 2. The semiconductor chip 3 is formed just above the first conductive pattern 12. The second conductive pattern 13 is formed on the fist surface of the insulating base material 2a so as to expose at least an end face at the side, and along two opposite sides of the wiring substrate 2 parallel to the two sides on which the electrode pads 9 of the semiconductor chip 3 are not formed. The second conductive pattern 13 is exposed through the openings 11 in the insulating film 2b, and has a plating layer 15 formed on the surface of the second conductive pattern 13. The first conductive pattern 12 is connected to the second conductive pattern 13 by a plurality of connection wirings 14. The first conductive pattern 12, the second conductive pattern 13, and the connection wirings 14 are formed of a material having high thermal conductivity, such as Cu. The second conductive pattern 13 is wider than the wiring patterns, and is configured so as to extend and be exposed, for example, over nearly the entire length along the side face of the wiring substrate 2 as shown in FIG. 2b. Although the surface exposed from the side face of the second conductive pattern 13 may be divided into several sections, the conductive pattern preferably extends continuously along the side face so as to enlarge the area exposed from the side face of the second conductive pattern 13.

Connecting the first conductive pattern 12 and the second conductive pattern 13 disposed just below the semiconductor chip 3 in this way facilitates transferring heat generated by the semiconductor chip 3 through the first conductive pattern 12 to the second conductive pattern 13. Exposing an end face of the second conductive pattern 13 at the side facilitates expelling heat from the exposed end face of the second conductive pattern 13 to outside the semiconductor device 1. Therefore, this impedes the semiconductor chip 3 itself becoming heated, and improves the reliability of the semiconductor device 1. Configuring the semiconductor device 1 so that the second conductive pattern 13 is exposed through the openings 11 in the insulating film 2b and also forming the plating layer 15 on the second conductive pattern 13 can increase the area of metal exposed at the side to the extent of the plating layer 15.

There is no need to form additional heat-dissipating solder balls or the like, which also reduces the production cost of the semiconductor device 1.

The production process of the semiconductor device 1 of the first embodiment of the present invention will be described hereinafter using FIGS. 5a-5f.

Figure 5A:
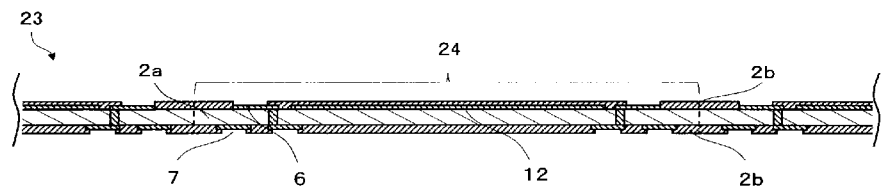
FIG. 5a is a sectional view showing an assembly process of the semiconductor device of the first embodiment.

First, as shown in FIG. 5a, a motherboard 23 is prepared having a plurality of product formation components 24 (components which will become wiring substrates 2 after cutting) arrayed in a matrix. A plurality of connection pads 6, the first conductive pattern 12, and the second conductive pattern 13 (see FIG. 1) are formed on a first surface of the product formation components 24 of the motherboard 23, and a plurality of lands 7 are formed on a second surface of the product formation components 24. Insulating films 2b are formed on both surfaces of the motherboard 23, and the connection pads 6, the first conductive pattern 12, the second conductive pattern 13, and the lands 7 are exposed from openings 11 in the insulating films 2b.

Figure 5B:
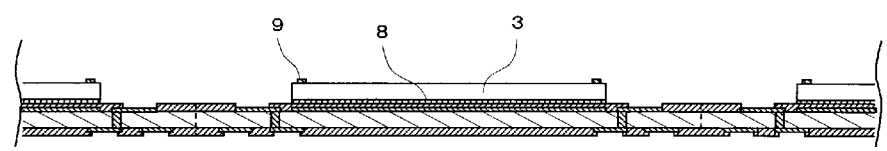
FIG. 5b is a sectional view showing an assembly process of the semiconductor device of the first embodiment.

Next, as shown in FIG. 5b, the adhesive member 8, such as an insulating paste or a DAF, is coated on the insulating film 2b in a central region of the first surface of the product formation components 24. The semiconductor chip 3 is then mounted on the coated adhesive member 8 so that the connecting surface of the semiconductor chip 3 faces a first surface of the wiring substrate 2. This semiconductor chip 3 has an Si substrate, on a first surface of which a DRAM memory circuit or the like is formed, and a plurality of electrode pads 9 are provided on the Si substrate. A passivation film (not shown) for protecting a circuit is formed on portions of a first surface of the semiconductor chip 3 except where the electrode pads 9 are formed.

Figure 5C:
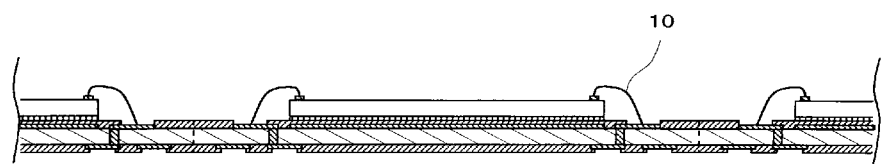
FIG. 5c is a sectional view showing an assembly process of the semiconductor device of the first embodiment.

Wire bonding is carried out after a semiconductor chip 3 has been mounted on each product formation component 24. As shown in FIG. 5c, the electrode pads 9 on the mounted semiconductor chip 3 are connected to the connection pads 6 on the motherboard 23 by conductive wires 10. The wires 10 comprise, for example, Au or Cu. A wire bonding apparatus (not shown) is used for wire bonding. Specifically, one end of a wire 10 melted to form a ball is bonded by ultrasonic thermocompression to an electrode pad 9 on the semiconductor chip 3, then the other end of the wire 10 is bonded by ultrasonic thermocompression to a connection pad 6 on the motherboard 23. The wires 10 are formed so as to describe a predetermined loop shape to avoid contact with the edges of the semiconductor chip 3.

Figure 5D:
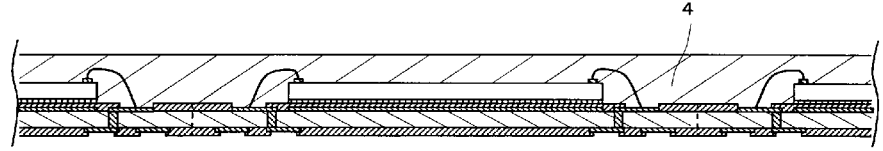
FIG. 5d is a sectional view showing an assembly process of the semiconductor device of the first embodiment.

Next, as shown in FIG. 5d, the sealing body 4 is formed on a first surface of the motherboard 23 so as to collectively cover the plurality of product formation components 24. Specifically, the sealing body 4 is formed using a molding apparatus such as a transfer molding apparatus having a molding die (not shown) comprising an upper die and a lower die. A large enough cavity is formed in the upper die to comprehensively cover the plurality of product formation components 24, and a depression for holding the motherboard 23 is formed in the lower die. The motherboard 23 with wires 10 formed is set in the depression of the lower die, and the peripheral edges of the motherboard 23 are clamped by the upper and lower dies so as to arrange the cavity above the motherboard 23. Subsequently, a thermosetting sealing resin such as an epoxy resin is packed into the cavity and cured by heating to a predetermined temperature (for example, 180° C.). As a result, the thermosetting resin is cured to form the sealing body 4 on the first surface of the motherboard 23.

Figure 5E:
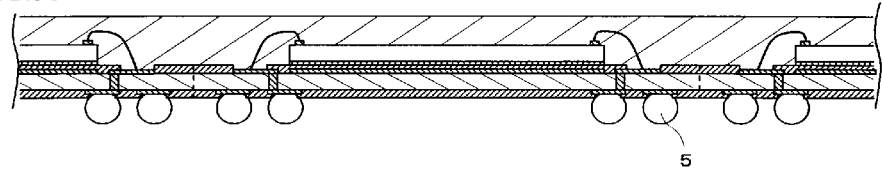
FIG. 5e is a sectional view showing an assembly process of the semiconductor device of the first embodiment.

After the sealing body 4 has been formed on the first surface of the motherboard 23, a ball mounting process is carried out to form solder balls 5 on a second surface of the motherboard 23. Specifically, as shown in FIG. 5e, conductive solder balls 5 are joined onto the plurality of lands 7 arranged on each of the product formation components 24 on the second surface of the motherboard 23. The plurality of solder balls 5 are suction-attached and held by a ball mounter (not shown) having a plurality of suction-attachment holes formed matching the arrangement of the lands 7, and are joined collectively to the lands 7 with flux in between.

Figure 5F:
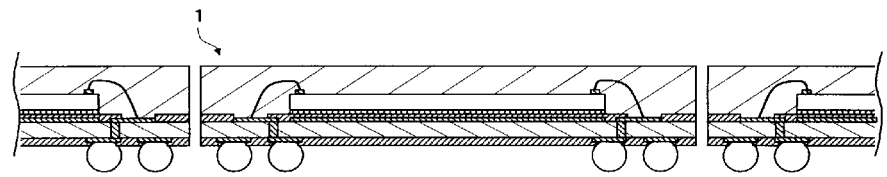
FIG. 5f is a sectional view showing an assembly process of the semiconductor device of the first embodiment.

Finally, the product formation components 24 are cut apart and separated by a dicing apparatus (not shown) to form the semiconductor device 1 as shown in FIG. 5f.

Figure 4:
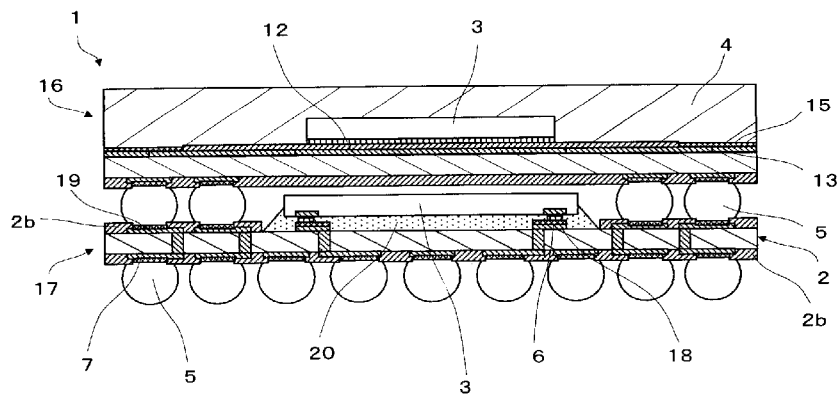
FIG. 4 is a sectional view showing a PoP semiconductor device of the first embodiment.

FIG. 4 is a sectional view showing a PoP semiconductor device having a configuration in which an upper package 16 is stacked on a lower package 17 having a semiconductor chip 3, using the semiconductor device 1 configured as described earlier as the upper package 16.

The lower package 17 has a wiring substrate 2 on a first surface of which predetermined wiring patterns (not shown) have been formed, and a semiconductor chip 3 mounted in a central region of the first surface of the wiring substrate 2 with an underfill material 20 in between. FIG. 2a schematically shows the region 25 of the lower package 17 where the semiconductor chip 3 is formed. Both surfaces of the wiring substrate 2 are covered by insulating films 2b, and openings are disposed in the insulating films 2b. Connection lands 19 for connecting to the solder balls 5 of the upper package 16, and connection pads 6 connected to the semiconductor chip 3 are exposed through the openings in the first surface of the wiring substrate 2. A plurality of lands 7 connected to the solder balls 5 are exposed through the openings in the second surface of the wiring substrate 2.

The solder balls 5 on the second surface of the wiring substrate 2 of the upper package 16 are connected to the connection lands 19 on the first surface of the wiring substrate 2 of the lower package 17 to form a PoP semiconductor device 1 having two different semiconductor chips 3. During this connection, the semiconductor chip 3 mounted on the lower package 17 does not contact the solder balls 5 on the second surface of the wiring substrate 2 of the upper package 16 because the solder balls 5 are disposed in a central region of the second surface of the wiring substrate 2 of the upper package 16. That is, the solder balls 5 on the second surface of the wiring substrate 2 of the upper package 16 contact the wiring substrate 2 of the lower package 17 without contacting the semiconductor chip 3 of the lower package 17.

Thus, there is no need to dispose heat-dissipating solder balls in a central region of the second surface of the wiring substrate 2 to expel heat from a mounting substrate because the heat of the semiconductor chip 3 is expelled outside the semiconductor device 1 from the side through the first conductive pattern 12 and the second conductive pattern 13. When a configuration having a first conductive pattern 12 and a second conductive pattern 13 connected to the first conductive pattern and exposed at one side is applied to the upper package 16 of the PoP semiconductor device 1 formed by stacking the upper package 16 on the lower package 17, this configuration more readily expels the heat of the semiconductor chip 3 of the upper package 16 outside the semiconductor device 1 from the end face of the second conductive pattern 13 exposed at the side, and improves the reliability of the PoP semiconductor device 1.

With the present embodiment, the first conductive pattern 12, the second conductive pattern 13, and the connection pads 6 are formed in the same layer interposed between the insulating base material 2a and the insulating film 2b. The connection pads 6, however, may be formed in a separate layer from the conductive patterns. The connection pads 6 may also be formed of a different material from the conductive patterns.

Second Embodiment

Figure 6:
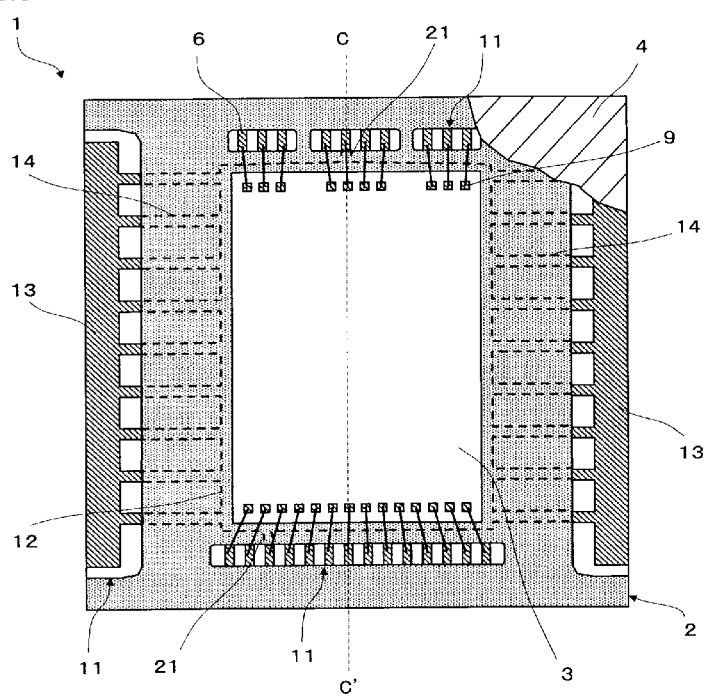
FIG. 6 is a plan view showing a semiconductor device of a second embodiment of the present invention.
Figure 7:
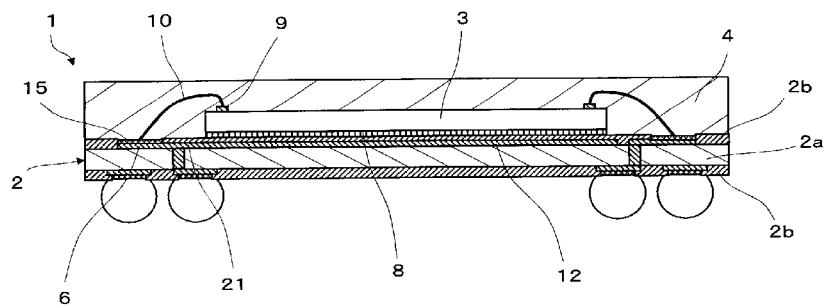
FIG. 7 is a sectional view at C-C' in FIG. 6.

FIG. 6 is a plan view showing a semiconductor device of a second embodiment of the present invention, and FIG. 7 is a sectional view at C-C' in FIG. 6.

Besides the configuration of the first embodiment, the semiconductor device 1 of the present embodiment has a configuration in which the first conductive pattern 12 is electrically connected through a wiring 21 to the connection pads 6, which are connected to a power source or a ground (GND).

Figure 8:
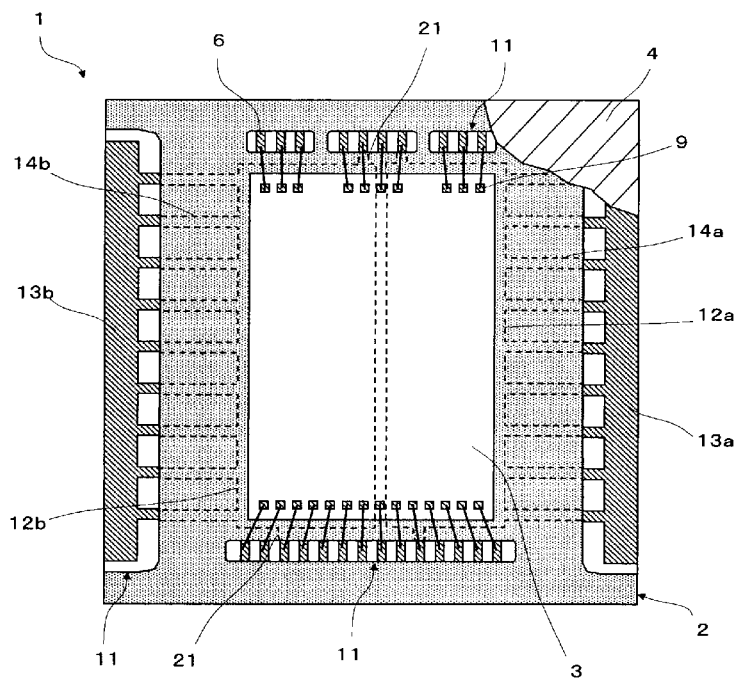
FIG. 8 is a plan view showing a variant example of the semiconductor device of the second embodiment.

FIG. 8 is a plan view showing a variant example of the semiconductor device in the second embodiment.

With the semiconductor device 1 of the present embodiment, the first conductive pattern 12 is divided into a first conductive pattern (power source) 12a connected to connection pads 6 which are connected to a power source, and a first conductive pattern (GND) 12b connected to connection pads 6 which are connected to a ground (GND). Similarly, the second conductive pattern 13 is divided into a second conductive pattern (power source) 13a connected to the first conductive pattern (power source) 12a, and a second conductive pattern (GND) 13b connected to the first conductive pattern (GND) 12b. The first conductive pattern (power source) 12a is connected to the second conductive pattern (power source) 13a by connection wiring (power source) 14a. The first conductive pattern (GND) 12b is connected to the second conductive pattern (GND) 13b by connection wiring (GND) 14b.

The rest of the configuration and the production process of the semiconductor device 1 of the present embodiment and variant example are the same as in the first embodiment, and will not be repeated.

By electrically connecting the first conductive pattern 12 through wiring 21 to connection pads 6 which are connected to a power source or a ground (GND) in this way, the first conductive pattern 12 and the second conductive pattern 13 are used as a part of the wiring pattern of the wiring substrate 2. Therefore, forming the first conductive pattern 12 and the second conductive pattern 13 together with the wiring pattern of the wiring substrate 2 simplifies the production process. As a result, this reduces the production cost of the semiconductor device 1. Otherwise, the present embodiment achieves the same effects as the first embodiment.

Third Embodiment

Figure 9:
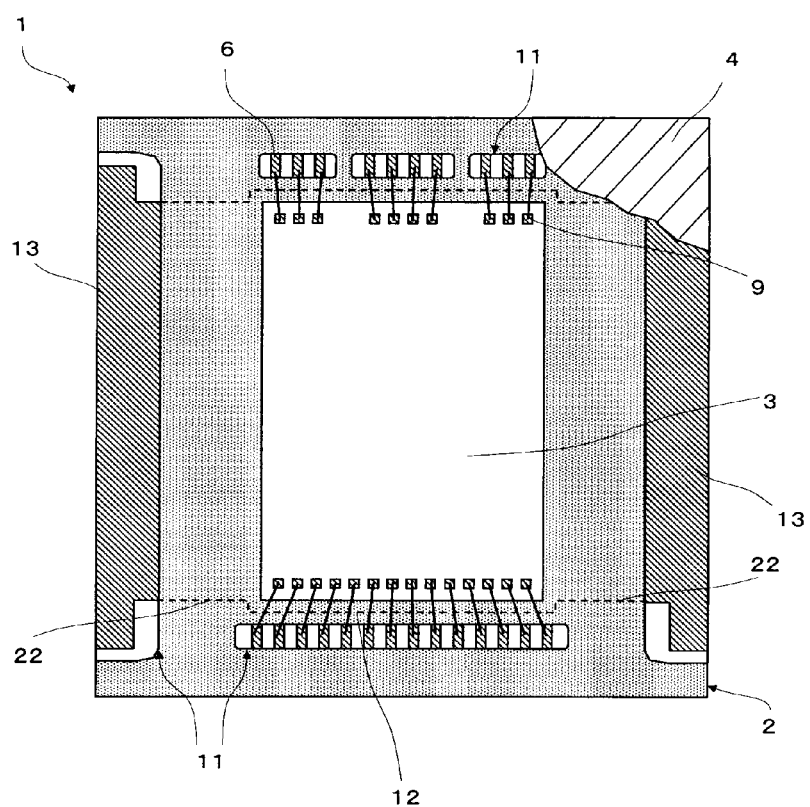
FIG. 9 is a plan view showing a semiconductor device of a third embodiment of the present invention.

FIG. 9 is a plan view showing a semiconductor device of a third embodiment of the present invention.

The semiconductor device 1 of the present embodiment has a configuration in which a connection wiring linking the first conductive pattern 12 to the second conductive pattern 13 is formed by a connection conductive pattern 22 having a large surface area in plan view. This connection conductive pattern 22, like the first conductive pattern 12 and the second conductive pattern 13, is formed of Cu or the like.

The rest of the configuration and the production process of the semiconductor device 1 of the present embodiment are the same as in the first embodiment, and will not be repeated.

Disposing the connection conductive pattern 22 in this way increases the region of linkage between the first conductive pattern 12 and the second conductive pattern 13, and increases the heat transferred from the first conductive pattern 12 to the second conductive pattern 13. Therefore, the heat generated by the semiconductor chip 3 is easily expelled through the first conductive pattern 12, the connection conductive pattern 22, and the second conductive pattern 13 and from an end face of the second conductive pattern 13 exposed at one side to outside the semiconductor device 1. As a result, this impedes the semiconductor chip 3 itself becoming heated, and improves the reliability of the semiconductor device 1. Otherwise, the present embodiment achieves the same effects as the first embodiment.

Fourth Embodiment

Figure 10:
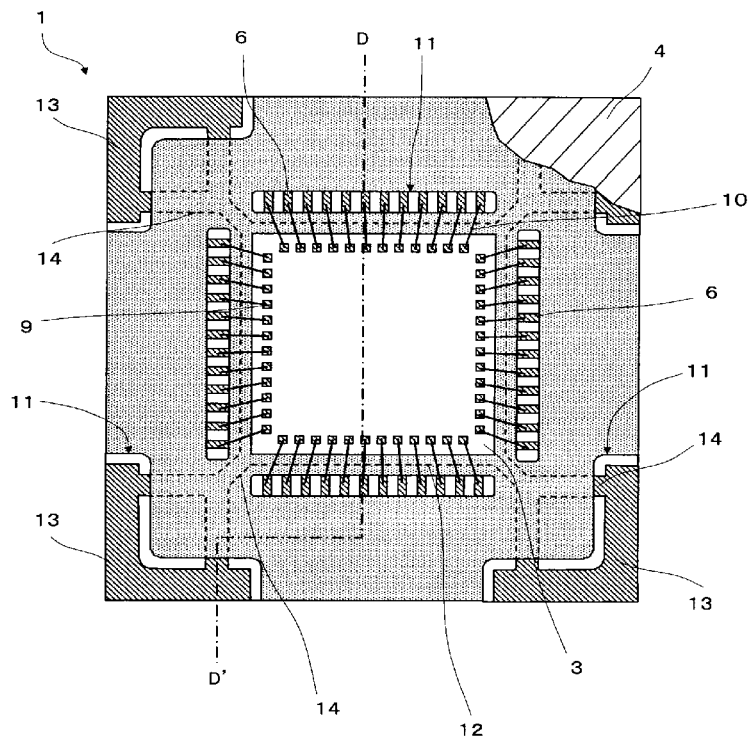
FIG. 10 is a plan view showing a semiconductor device of a fourth embodiment of the present invention.
Figure 11:
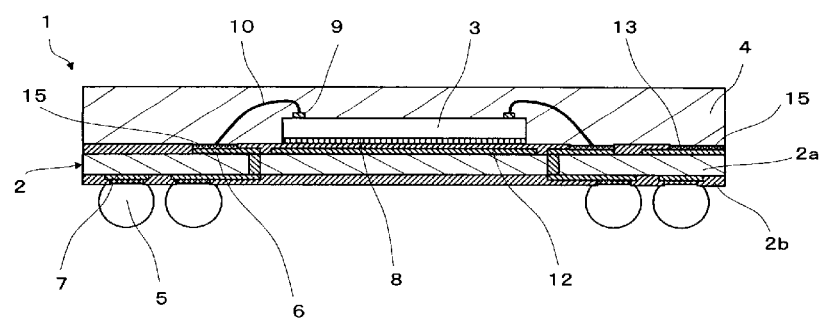
FIG. 11 is a sectional view at D-D' in FIG. 10.

FIG. 10 is a plan view showing a semiconductor device of a fourth embodiment of the present invention, and FIG. 11 is a sectional view at D-D' in FIG. 10.

The semiconductor device 1 of the present embodiment has a wiring substrate 2, a semiconductor chip 3 mounted in a central region of a first surface of the wiring substrate 2, and a sealing body 4 formed on the first surface of the wiring substrate 2. The sealing body 4 has been partially cut away in FIG. 10 to show the internal configuration.

Both surfaces of the wiring substrate 2 are covered by insulating films 2b except for openings 11. A plurality of connection pads 6 along each side of the mounted semiconductor chip 3 are exposed within the openings 11 in the first surface of the wiring substrate 2. A plurality of lands 7 are exposed within the openings 11 on the second surface of the wiring substrate 2. The lands 7 and a plurality of solder balls 5 connected to the lands are disposed in two rows along two sides of the wiring substrate 2, in a region excluding the central region of the second surface of the wiring substrate 2.

The semiconductor chip 3 is formed in a rectangular plate shape, and a plurality of electrode pads 9 are disposed along each side of the semiconductor chip 3 on the first surface of the semiconductor chip 3. The connection pads 6 of the wiring substrate 2 are electrically connected to the electrode pads 9 of the semiconductor chip 3 by conductive wires 10.

The first conductive pattern 12 is formed between a first surface of the insulating base material 2a of the wiring substrate 2, and the insulating film 2b. The semiconductor chip 3 is formed just above the first conductive pattern 12. An end face of the second conductive pattern 13 is formed on the first surface of the insulating base material 2a so that at least a portion is exposed at the side at the four corners of the wiring substrate 2. The second conductive pattern 13 is exposed within the openings 11 in the insulating film 2b, and a plating layer 15 is formed on the surface of the second conductive pattern 13. The first conductive pattern 12 is connected to the second conductive pattern 13 by a plurality of connection wirings 14.

The production process of the semiconductor device 1 of the present embodiment is the same as in the first embodiment, and will not be repeated.

By disposing the second conductive pattern 13 at the four corners of the wiring substrate 2 in this way, the connection pads 6 and the electrode pads 9 can be formed along each side of the semiconductor chip 3, and a greater number of electrode pads 9 can be disposed on the semiconductor chip 3. Otherwise, the present embodiment achieves the same effects as the first embodiment.

Although specific configurations of the semiconductor device of the present invention were described on the basis of embodiments, the present invention is not limited to the embodiments described herewithin, and needless to say, various modifications of these embodiments are possible without departing from the scope of the present invention. For example, although a semiconductor device 1 having one semiconductor chip 3 mounted on one wiring substrate 2 was described in the embodiments, the present invention may equally be applied to a semiconductor device 1 having a plurality of semiconductor chips 3 arranged in a plane on one wiring substrate 2. Alternatively, the present invention may equally be applied to a semiconductor device 1 having a plurality of stacked semiconductor chips 3 (multi-chip package: MCP) mounted on one wiring substrate 2.

Although an application to a semiconductor device having a mounted DRAM semiconductor chip was described in the embodiments, the present invention may also be applied to a semiconductor device having a mounted semiconductor chip other than a DRAM, such as a logic chip or a flash memory.

What is claimed is:

1. A semiconductor device comprising:
    a wiring substrate having an insulating base material, a first conductive pattern formed on a first surface of the insulating base material, and a second conductive pattern formed on the first surface of the insulating base material, connected to the first conductive pattern, and exposed to the side at an end face;
    a semiconductor chip mounted on the wiring substrate so as to overlie the first conductive pattern; and
    a sealing body formed on the wiring substrate so as to cover the semiconductor chip.

2. The semiconductor device as claimed in claim 1, wherein the wiring substrate has an insulating film formed on the first surface of the insulating base material so as to cover the first conductive pattern and expose the second conductive pattern.

3. The semiconductor device as claimed in claim 1, wherein a plating layer is disposed on the surface of the second conductive pattern.

4. The semiconductor device as claimed in claim 1, wherein the first conductive pattern is connected to the second conductive pattern by a connection wiring.

5. The semiconductor device as claimed in claim 1, wherein the wiring substrate has a connection pad, and the insulating film has an opening located opposite the connection pad; and
    the first conductive pattern is connected to the connection pad.

6. A semiconductor device comprising:
    a wiring substrate having an insulating base material, and a wiring pattern and a connection pad formed on a first surface of the insulating base material;
    a semiconductor chip mounted on the wiring substrate so as to overlie the wiring pattern; and
    a sealing body formed on the first surface of the wiring substrate so as to cover the semiconductor chip;
    wherein a portion of the wiring pattern comprises a first conductive pattern connected to the connection pad, and a second conductive pattern connected to the first conductive pattern and exposed to the side at an end face.

7. A semiconductor device comprising:
    an upper package having:
        a wiring substrate having an insulating base material, a first conductive pattern formed on a first surface of the insulating base material, and a second conductive pattern formed on the first surface of the insulating base material, connected to the first conductive pattern, and exposed to the side at an end face;
        a semiconductor chip mounted on the wiring substrate so as to overlie the first conductive pattern;
        a sealing body formed on the wiring substrate so as to cover the semiconductor chip; and
        metal balls disposed on a second surface of the wiring substrate along each side of the wiring substrate in a region excluding a central region of the wiring substrate; and
    a lower package having a wiring substrate comprising an insulating base material, a semiconductor chip mounted on a first surface of the wiring substrate, and metal balls mounted on a second surface of the wiring substrate;
    wherein the upper package and the lower package are stacked so that the metal balls of the upper package do not contact the semiconductor chip of the lower package, and contact the wiring substrate of the lower package.

8. The semiconductor device as claimed in claim 7, wherein connection lands are disposed on the first surface of the wiring substrate of the lower package, and the metal balls of the upper package are connected to the connection lands of the lower package.

* * * * *